(12) United States Patent
Engquist et al.

(10) Patent No.: US 9,007,083 B2
(45) Date of Patent: Apr. 14, 2015

(54) SELF-RETAINING VIA PROBE

(75) Inventors: David T. Engquist, Beaverton, OR (US); Brian S. Mantel, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 665 days.

(21) Appl. No.: 13/197,662

(22) Filed: Aug. 3, 2011

(65) Prior Publication Data
US 2013/0033280 A1 Feb. 7, 2013

(51) Int. Cl.
*G01R 1/067* (2006.01)

(52) U.S. Cl.
CPC ........ *G01R 1/06733* (2013.01); *G01R 1/06788* (2013.01)

(58) Field of Classification Search
None
See application file for complete search history.

(56) References Cited

U.S. PATENT DOCUMENTS

| | | | |
|---|---|---|---|
| 2,015,421 A * | 9/1935 | Eckstein et al. | 439/692 |
| 5,223,787 A | 6/1993 | Smith et al. | |
| 5,259,111 A * | 11/1993 | Watanabe | 29/885 |
| 5,957,222 A * | 9/1999 | Webb et al. | 175/45 |
| 6,222,378 B1 | 4/2001 | Campbell et al. | |
| 7,247,050 B1 | 7/2007 | Minich | |
| 7,896,693 B2 * | 3/2011 | Kondo et al. | 439/567 |
| 2009/0153159 A1 | 6/2009 | Reed et al. | |
| 2009/0302874 A1 | 12/2009 | Harvey et al. | |
| 2010/0073018 A1 | 3/2010 | Ruppelt | |

FOREIGN PATENT DOCUMENTS

EP 0762599 A2 3/1997

OTHER PUBLICATIONS

European Patent Office, Extended European Search Report, EP Application No. 12176965.7, Oct. 28, 2014, pp. 1-7, EPO, Munich, Germany.

* cited by examiner

*Primary Examiner* — Paresh Patel
(74) *Attorney, Agent, or Firm* — Thomas F. Lenihan; Marger Johnson & McCollom PC

(57) ABSTRACT

A planar body is configured such that its edges engage the sidewall of a via of a device under test to create point electrical contacts and the planar body resists removal of the planar body from the via after insertion. The edges of the planar body may include barbs that create point electrical contacts and resist removal of the planar body from the via after insertion. The end of the body that is inserted into the via may form a tapered tip to facilitate insertion. The end of the planar body that is inserted into the via may include barbs that resist removal of the planar body from the via after insertion. The edges of the planar body may include stops that prevent further insertion of the planar body into the via beyond the stops.

25 Claims, 6 Drawing Sheets

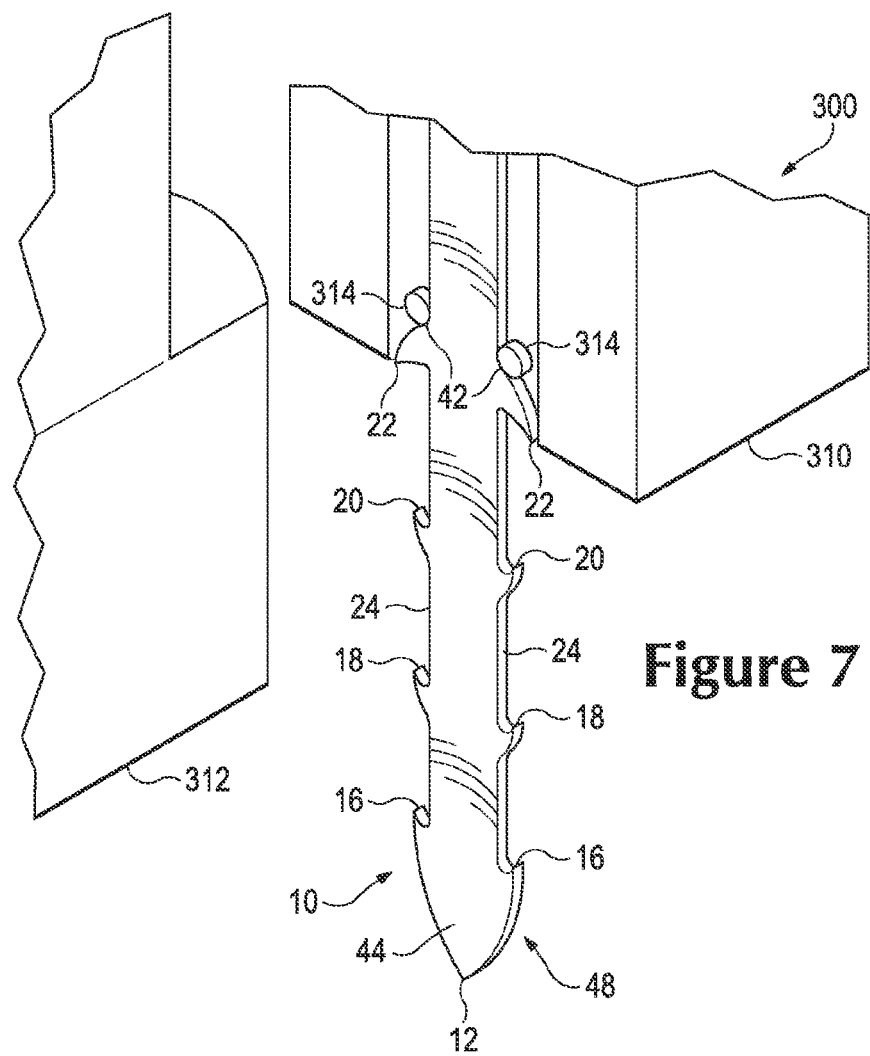

US 9,007,083 B2

SELF-RETAINING VIA PROBE

FIELD OF THE INVENTION

The present invention relates to logic analyzer and oscilloscope probes, and more particularly to probing devices under test.

BACKGROUND OF THE INVENTION

A secure and reliable method of probing many different signals simultaneously and feeding them back to a logic analyzer or oscilloscope is required to acquire the desired data from a Device Under Test (DUT). Conventionally, there are two options for probing in this way. The first option is to design into the DUT, a logic analyzer or oscilloscope connector or land pattern, at a specific location. This connector or land pattern interfaces with a logic analyzer or oscilloscope probe. This can be problematic if the traces must detour from their natural path to this location, because such a detour adds signal loss to the circuit being tested. This approach also reduces the flexibility of the layout design and occupies valuable circuit board space.

The second option is to attach the logic analyzer or oscilloscope probes to existing component leads. However, newer and emerging circuit board technologies, such as surface mount components and ball-grid-array components, reduce the number of available leads to which a logic analyzer or oscilloscope probe may be attached. These technologies can even "hide" all potential test points completely, making it impossible to attach the logic analyzer or oscilloscope probes anywhere on the circuit board.

For applications where a convenient test point is accessible, a third option most commonly applied to oscilloscopes is the original hand-held probe. This method keeps a user's hand occupied during probing and relies on an individual's manual dexterity to keep the probe placed in the right location while visual attention is focused on data from the oscilloscope. Because of the human intervention in this process, the connection is not as secure and reliable as it could be.

When none of the conventional options can be utilized, one of the few remaining options for probing a test point is to attach a logic analyzer or oscilloscope probe to vias in the DUT. However, vias are small features, which makes it difficult to retain a logic analyzer probe within a via during a test. A via is a vertical electrical connection between different layers of conductors in a printed circuit board. It consists of two or more pads, in corresponding positions on different layers of the board, which are electrically connected by a cylindrical hole drilled through the board. The hole is made conductive by electroplating, or is lined with a conductive tube or a rivet.

Therefore, there is a need for a probe that retains itself in a via of a Device Under Test (DUT).

SUMMARY OF THE INVENTION

The present invention provides an improved self-retaining via probe, and overcomes the above-mentioned disadvantages and drawbacks of the prior art. As such, the general purpose of the present invention, which will be described subsequently in greater detail, is to provide an improved self-retaining via probe that has all the advantages of the prior art mentioned above.

To attain this, the preferred embodiment of the present invention essentially comprises a planar body that is configured such that its edges engage the sidewall of a via of a device under test to create point electrical contacts and the planar body resists removal of the planar body from the via after insertion. The edges of the planar body may include barbs that create point electrical contacts and resist removal of the planar body from the via after insertion. The end of the body that is inserted into the via may form a tapered tip to facilitate insertion. The end of the planar body that is inserted into the via may include barbs that resist removal of the planar body from the via after insertion. The edges of the planar body may include stops that prevent further insertion of the planar body into the via beyond the stops. There are, of course, additional features of the invention that will be described hereinafter and which will form the subject matter of the claims attached.

There has thus been outlined, rather broadly, the more important features of the invention in order that the detailed description thereof that follows may be better understood and in order that the present contribution to the art may be better appreciated.

BRIEF DESCRIPTION OF THE DRAWINGS

FIG. 7 is a perspective exploded view of a tool for inserting a via anchor of the self-retaining via probe into a via.

The same reference numerals refer to the same parts throughout the various figures.

DETAILED DESCRIPTION OF THE DRAWING

Figure 1:
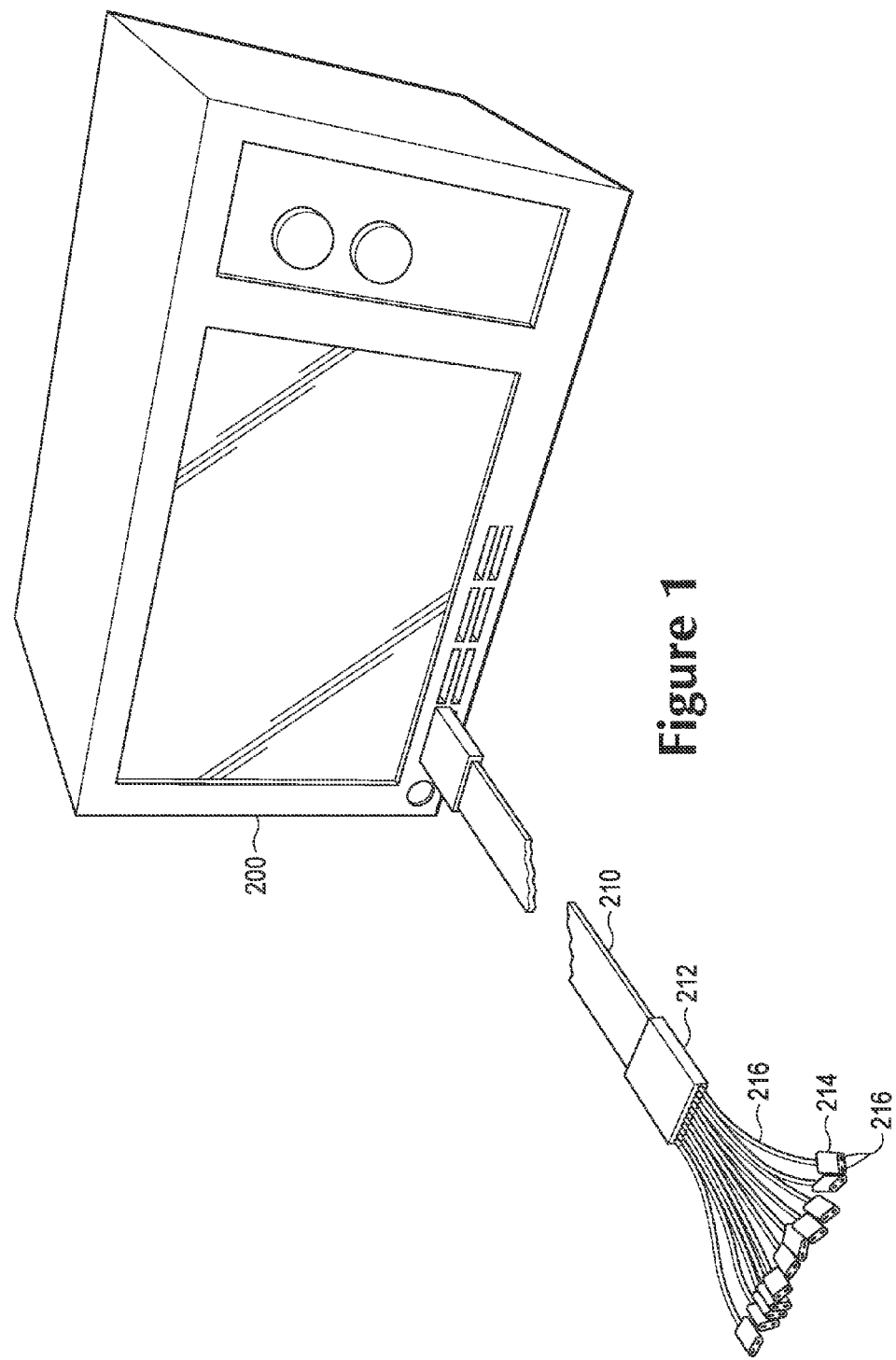
FIG. 1 is a perspective view of a logic analyzer.

A preferred embodiment of the self-retaining via probe of the present invention is shown and generally designated by the reference numeral 10.

FIG. 1 illustrates a perspective view of a logic analyzer 200. More particularly, the logic analyzer 200 is connected to a waystation 212 by a ribbonized coaxial cable 210. Individual coaxial cable strands 216 emerge from the waystation and each terminate in a podlet 214. Each of the podlets 214 has an opening 216 that receives a self-retaining via probe 10.

Figure 2:
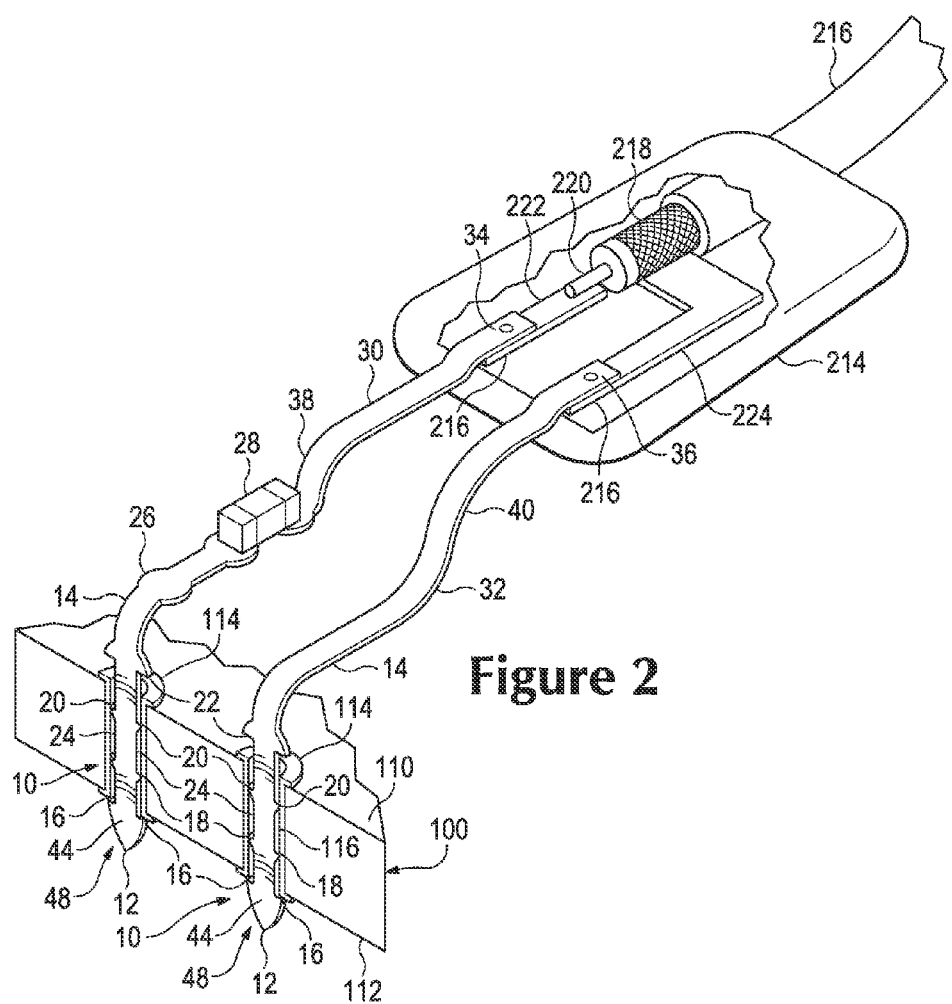
FIG. 2 is a perspective sectional view of a podlet attached to a device under test by self-retaining via probes constructed in accordance with the principles of the present invention.

FIG. 2 illustrates a perspective sectional view of a podlet 214 of FIG. 1 attached to a Device Under Test (DUT) 100 by self-retaining via probes 10 (a signal via probe 38 and a ground via probe 40). More particularly, the podlet contains, on one side, the end of a coaxial cable strand 216 leading back to the waystation 212 of FIG. 1 and subsequently to the logic analyzer 200. Within the podlet, the center conductor 220 of the coaxial cable strand attaches to a metal contact 222. The metal contact in turn makes a non-permanent, snap-on contact with the probe tip 34 of the backend 30 of the signal via probe 38. This contact exists so that the probe tip can be easily replaced to provide user options and repair capabilities. The serve 218 (also sometimes referred to as the braid), which provides a grounding shield to the coaxial cable strand, is terminated to a ground solder strap 224. This strap also interfaces via a non-permanent, snap-on contact with the probe tip 36 of the backend 32 of the ground via probe 40, which is attached to the DUT's ground.

Both the signal via probe 38 and the ground via probe 40 include a via anchor 48, which enables the self-retaining via probes 10 to engage and retain themselves within the vias 114 of the DUT 100. The signal via probe 38 includes a pad 26 in close proximity to the via anchor's base 14. The pad enables attachment of a passive isolation network 28. The passive isolation network is positioned in series. The passive isolation network serves to isolate the load of the self-retaining via probe from the DUT. Typically, the passive isolation network consists of a chip resistor and an optional capacitor in parallel with the resistor for better high frequency response.

An advantage of the backends 30 and 32 is they provide a flexible means of attaching to a nearby ground. While many logic analyzer probes rely on tips that require a fixed spacing between the ground and signal pad, it is sometimes difficult to find a ground at this fixed distance. The backends can be bent to enable the ground via probe 40 to address any of the ground vias located adjacent to the area being probed by the signal via probe 38.

Figure 3:
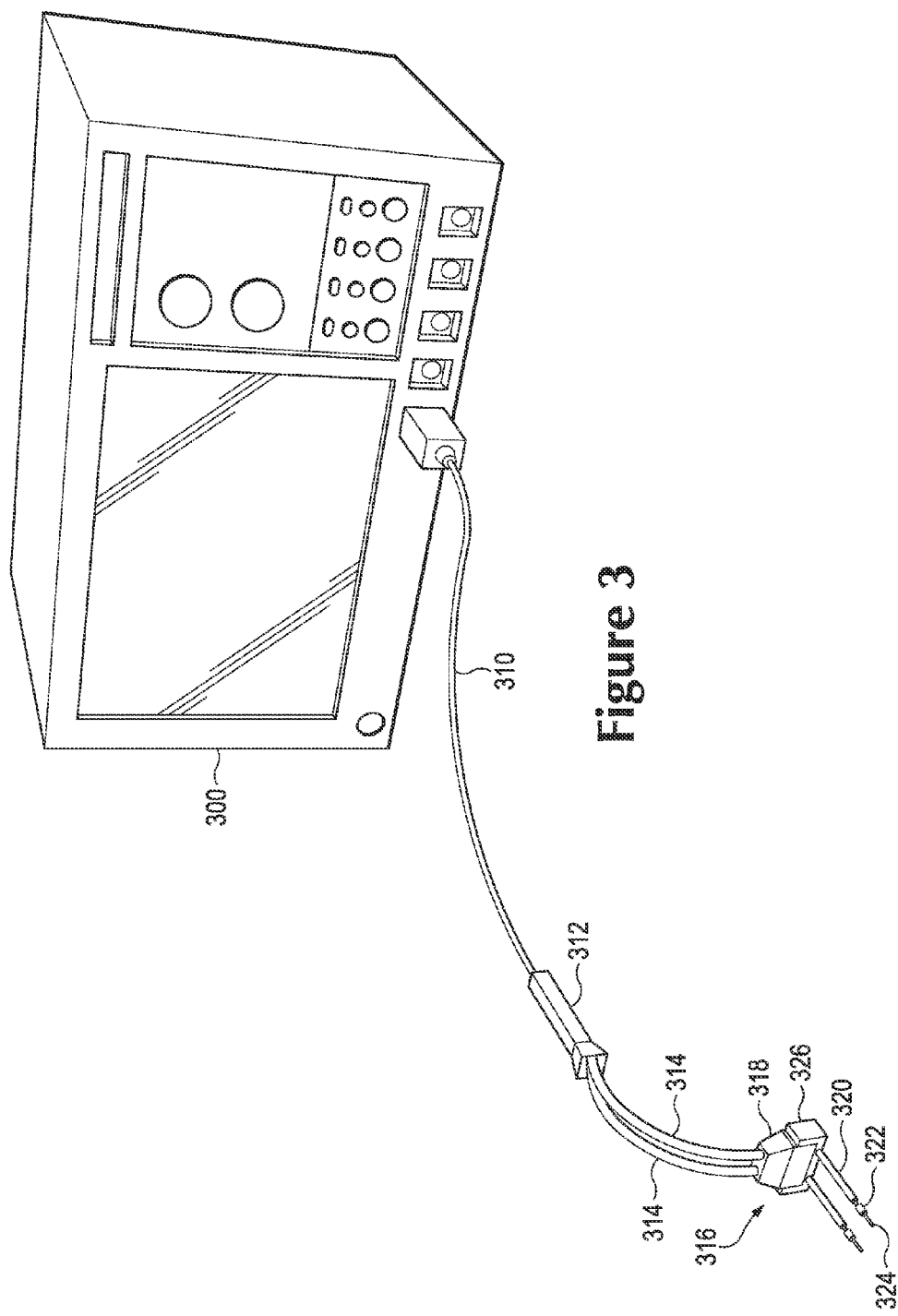
FIG. 3 is a perspective view of an oscilloscope.

FIG. 3 illustrates a perspective view of an oscilloscope 300. More particularly, the oscilloscope 300 is connected to a differential probe 312 by a cable 310. Two cables 314 emerge from the differential probe and terminate in a probe lead 318. A resistor tip clip assembly 316 is detachably connected to the probe lead by a connector 326. Two cables 320 extend from the connector. Each of the cables 320 is attached to a resistor 322 with a wire segment 324.

Figure 4:
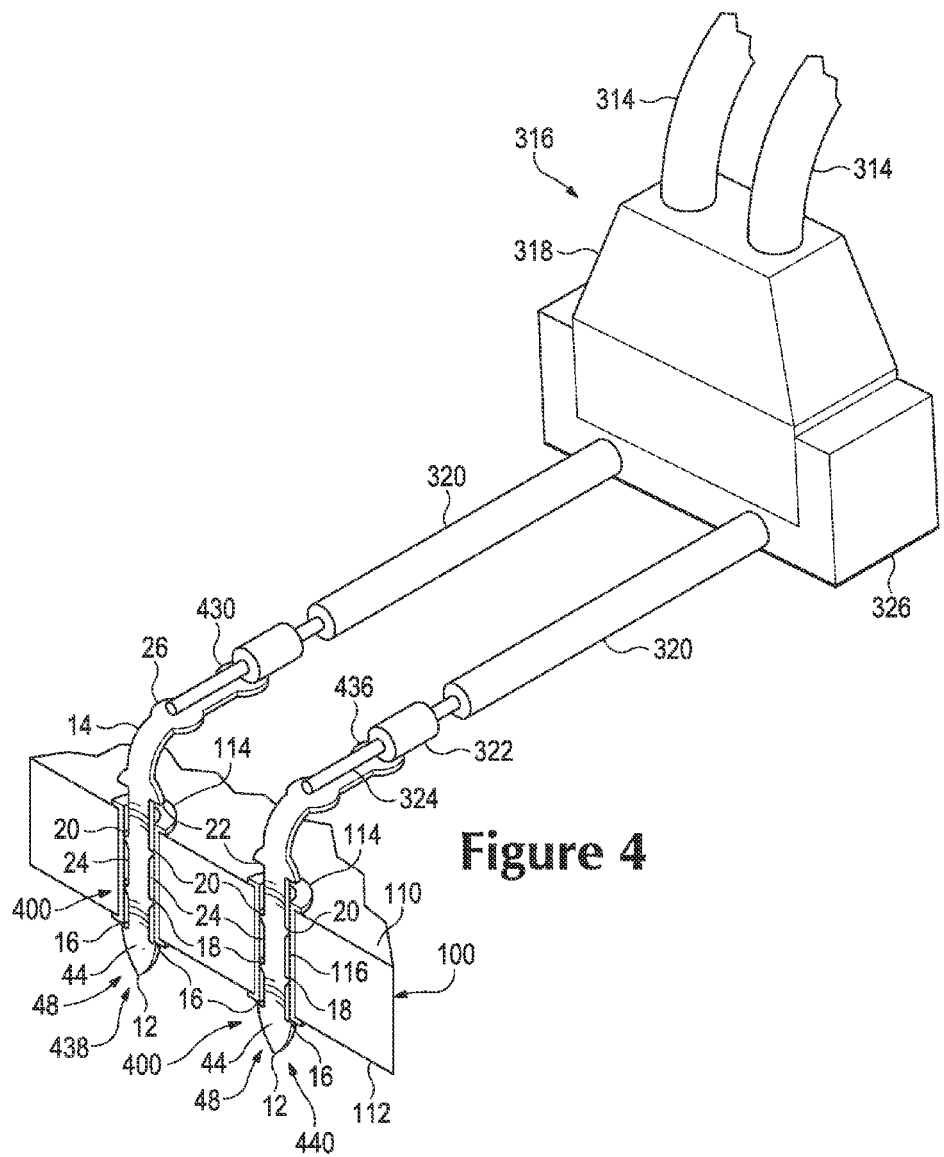
FIG. 4 is a perspective sectional view of a resistor tip clip assembly attached to a device under test by alternative embodiments of the self-retaining via probes constructed in accordance with the principles of the present invention.

FIG. 4 illustrates a perspective view of a tip clip assembly 316 of FIG. 3 attached to a Device Under Test (DUT) 100 by self-retaining via probes 400 (a signal via probe 438 and a ground via probe 440, which is attached to the DUT's ground). More particularly, both the signal via probe and the ground via probe include a via anchor 48, which enables the self-retaining via probes 400 to engage and retain themselves within the vias 114 of the DUT 100. Both the signal via probe and the ground via probe also include a pad 26 in close proximity to the bases 14 of their via anchors. The wire segments 324 of the tip clip assembly are attached to the pads 26 to create an electrical connection between the cables 320 leading back to the probe lead 318 of FIG. 3 and subsequently to the oscilloscope 300. In the current embodiment, the wire segments are soldered to the pads to create a semi-permanent contact between the wire segments and pads. However, the wire segments can be un-soldered from the signal via probe and the ground via probe so that the signal via probe and the ground via probe can be easily replaced to provide options and repair capabilities to a user.

An advantage of the cables 320 is that they provide a flexible means of attaching to a nearby ground. As a result, the backends 430 and 436 of the signal via probe 438 and ground via probe 440 are truncated compared to the backends 30 and 36 of the signal via probe 38 and ground via probe 40. While many oscilloscope probes rely on tips that require a fixed spacing between the ground and signal pad, it is sometimes difficult to find a ground at this fixed distance. The cables 320 can be bent to enable the ground via probe 440 to address any of the ground vias located adjacent to the area being probed by the signal via probe 438.

Figure 5:
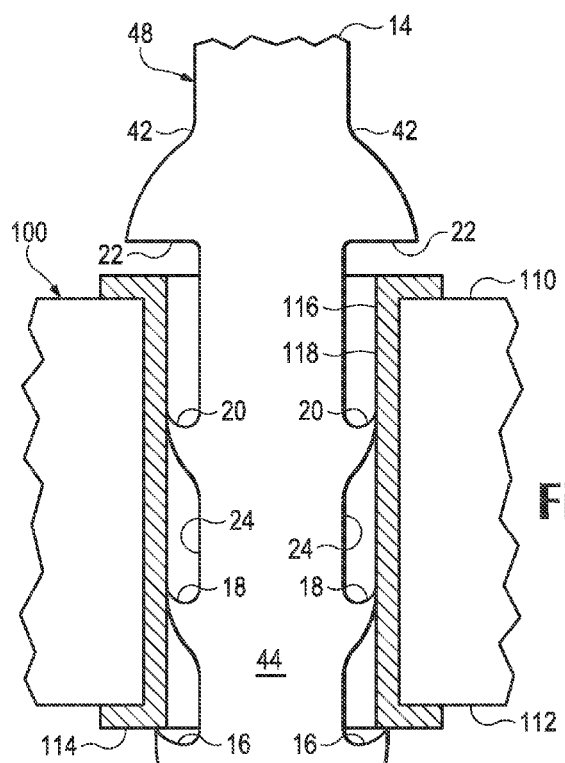
FIG. 5 is a close-up sectional view of a via anchor of the self-retaining via probe inserted into a via.

FIG. 5 illustrates a close-up sectional view of a via anchor 48 inserted into a via 114. More particularly, the via anchor is a planar body with a tapered, arrowhead-like tip 12 for easy insertion through a via. Barbs 16 located behind the tip resist backing out by engaging with the bottom face 112 of the DUT once the via anchor is fully inserted and the tip pokes through the DUT 100. Barbs 18 and 20 on the edges 24 of the via anchor terminate in sharp points that engage the sidewall 116 of the via to create point electrical contacts. Physical stops 22 at the base 14 of the anchor prevent the via anchor from being inserted too far into the via and provides tactile feedback to the user that the via anchor is fully inserted.

Figure 6A:
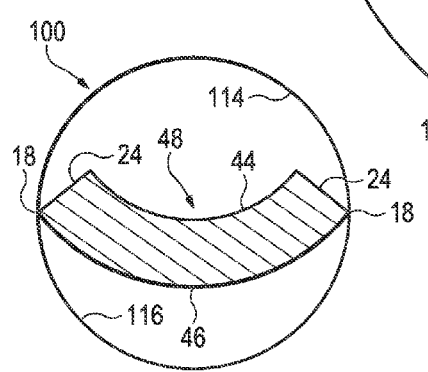
FIG. 6A is a close-up sectional view of a via anchor of the self-retaining via probe that has flexed in an arc during insertion.
Figure 6B:
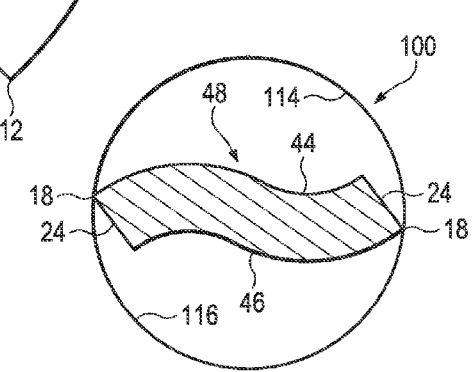
FIG. 6B is a close-up sectional view of a via anchor of the self-retaining via probe that has flexed in a sinusoid shape during insertion.

FIG. 6A illustrates a close-up sectional view of a via anchor 48 that has flexed in an arc during insertion. FIG. 6B illustrates a close-up sectional view of a via anchor that has flexed in a sinusoid shape during insertion. More particularly, the via anchor material flexes either in an arc (the via anchor bends slightly during insertion into the via, with the front 44 becoming concave and the back 46 becoming convex) or a sinusoid shape (a result of the via anchor being twisted into the via). The subsequent flexing of the via anchor material after insertion forces the barbs 18 and 20 (only barbs 18 are visible) against the side wall of the via. In either configuration, the barbs contact the side walls with a force sufficient to establish a secure and reliable electrical connection between the via anchor and the via sidewall.

However, the via anchor is not intended to damage or destroy the DUT. The thin sheet metal of the via anchor only provides enough force to engage the via sidewall's copper plating 118 electrically. The contact force is too low to break through the surface finish to the copper plating during insertion or use of the self-retaining via probe 10.

The via anchors are removable from the vias, but the anchors are unlikely to be reusable because of the amount of deformation of the barbs 16 required to permit passage of the tip 12 back through the via. However, a low-cost process of manufacture makes the self-retaining via probes 10 economically feasible to be viewed as a consumable item.

FIG. 7 illustrates a perspective exploded view of a tool 300 for inserting a via anchor 48 into a via 114. More particularly, the tool assists in inserting the via anchor into the via and prevents tip buckling of the via anchor. This insertion tool slightly deforms the via anchor (within the elastic limits of the via anchor) to provide a cross-section that will endure the buckling insertion forces as the via anchor is inserted into a via. The tool has a core side 312 and a cavity side 310. The cavity side has two hubs 314 that locate the via anchor within the cavity side by contacting locations 42 on the stops 22. The core side 312 and cavity side 310 are then pinched together to squeeze and slightly flex the via anchor into the arc shown in FIG. 6A.

While current embodiments of the self-retaining via probe have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, different via anchor sizes could be made available to accommodate the assortment of via lengths and diameters found in industry.

Finally, while the illustrations show the via anchors of the current invention fully inserted through a circuit board, an alternative embodiment of the via anchors would not fully insert through a via and hook to the opposite side to resist removal. Instead, the alternative embodiment would rely on friction forces against the via sidewall for retention. This would be helpful in the cases of blind vias that do not fully pass through all layers of the Device Under Test and vias that have components mounted on their opposite end. While the retention of the alternative embodiment of the via anchors would not necessarily be as high as that of the current invention, it would still provide enough force to keep the via anchors in place during a test.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A self-retaining via probe comprising:
a planar body;
the planar body having opposed edges and opposed ends;
the planar body being configured such that the edges engage a sidewall of a via of a device under test to create point electrical contacts when one end of the planar body is inserted into the via; and
wherein the planar body is configured to resist the removal of the planar body from the via after insertion.

2. The probe of claim 1, wherein the edges of the planar body comprise a plurality of barbs that engage the sidewall of the via to create point electrical contacts and resist the removal of the planar body from the via after insertion.

3. The probe of claim 1, wherein the end of the planar body that is inserted into the via forms a tapered tip to facilitate insertion.

4. The probe of claim 1, wherein the end of the planar body that is inserted into the via comprises a plurality of barbs that extend outward from the edges of the planar body more than a diameter of the via and engage with a face of the device under test to resist the removal of the planar body from the via after insertion.

5. The probe of claim 1, wherein the sides of the planar body comprise a plurality of stops that extend outward from the edges of the planar body more than a diameter of the via and engage with a face of the device under test to prevent further insertion of the planar body into the via beyond the stops.

6. The probe of claim 1, wherein the end of the planar body that is not inserted into the via terminates in a non-permanent contact configured to create an electrical connection with a cable to transmit electrical signals from the via to the cable.

7. The probe of claim 6, wherein the wire is connected to one of the group consisting of a logic analyzer and an oscilloscope.

8. The probe of claim 1, wherein the planar body comprises a pad configured to attach to one of the group consisting of a passive isolation network and an oscilloscope probe.

9. The probe of claim 1, wherein the planar body is flexed into an arc prior to being inserted into the via.

10. The probe of claim 9, wherein the planar body is flexed into an arc prior to being inserted into the via by a tool.

11. The probe of claim 1, wherein the planar body is flexed into a sinusoidal shape by being twisted during insertion into the via.

12. A logic analysis system comprising:
a logic analyzer;
a cable having one end connected to the logic analyzer;
an opposing end of the cable connected to a waystation;
the waystation separating the cable into a plurality of cable strands;
each of the cable strands being connected to a podlet;
each of the podlets creating a non-permanent electrical connection between a cable strand and a signal via probe and a ground via probe;
the signal via probe and the ground via probe each having a via anchor;
each via anchor comprising:
a planar body;
the planar body having opposed edges and opposed ends;
the planar body being configured such that the edges engage a sidewall of a via of a device under test to create point electrical contacts when one end of the planar body is inserted into the via; and
wherein the end of the planar body that is inserted into the via is configured to resist the removal of the planar body from the via after insertion.

13. The system of claim 12, wherein the signal via probe and the ground via probe are flexible, such that the spacing between the signal via probe in the ground via probe is adjustable.

14. The system of claim 12, wherein the edges of the planar body comprise a plurality of barbs that engage the sidewall of the via to create point electrical contacts.

15. The system of claim 12, wherein the end of the planar body that is inserted into the via forms a tapered tip.

16. The system of claim 12, wherein the end of the planar body that is inserted into the via comprises a plurality of barbs that extend outward from the edges of the planar body more than a diameter of the via and engage with a face of the device under test to resist the removal of the planar body from the via after insertion.

17. The system of claim 12, wherein the edges of the planar body comprise a plurality of stops that extend outward from the edges of the planar body more than a diameter of the via and engage with a face of the device under test to prevent further insertion of the planar body into the via.

18. The system of claim 12, wherein the planar body of the via anchor of the signal via probe comprises a pad configured to attach to a passive isolation network between the via anchor and the non-permanent electrical connection between the cable strand and the signal via probe.

19. A signal probing system comprising:
an oscilloscope;
a cable having one end connected to the oscilloscope;
an opposing end of the cable connected to a differential probe;
the differential probe separating the cable into a plurality of cables;
the cables being connected to a probe lead;
the probe lead being connected to a resistor tip clip assembly;
each of the resistor tip clip assemblies creating a semi-permanent electrical connection between the probe lead and a signal via probe and a ground via probe;
the signal via probe and the ground via probe each having a via anchor;
each via anchor comprising:
a planar body;
the planar body having opposed edges and opposed ends;
the planar body being configured such that the edges engage a sidewall of a via of a device under test to create point electrical contacts when one end of the planar body is inserted into the via; and
wherein the end of the planar body that is inserted into the via is configured to resist the removal of the planar body from the via after insertion.

20. The system of claim 19, wherein the signal via probe and the ground via probe are flexible, such that the spacing between the signal via probe in the ground via probe is adjustable.

21. The system of claim 19, wherein the edges of the planar body comprise a plurality of barbs that engage the sidewall of the via to create point electrical contacts.

22. The system of claim 19, wherein the end of the planar body that is inserted into the via forms a tapered tip.

23. The system of claim 19, wherein the end of the planar body that is inserted into the via comprises a plurality of barbs that extend outward from the edges of the planar body more than a diameter of the via and engage with a face of the device under test to resist the removal of the planar body from the via after insertion.

24. The system of claim 19, wherein the edges of the planar body comprise a plurality of stops that extend outward from the edges of the planar body more than a diameter of the via and engage with a face of the device under test to prevent further insertion of the planar body into the via.

25. The system of claim 19, wherein the resistor tip clip assembly comprises a plurality of cables connected to resistors having wire segments having a free end, and wherein the planar body of the via anchor of the signal via probe and the planar body of the via anchor of the ground via probe each comprise a pad configured to attach to the free end of a wire segment of the resistor tip clip assembly.

* * * * *